(12) United States Patent
Myung et al.

(10) Patent No.: US 8,321,745 B2
(45) Date of Patent: Nov. 27, 2012

(54) APPARATUS AND METHOD FOR CHANNEL ENCODING AND DECODING IN COMMUNICATION SYSTEM USING LOW-DENSITY PARITY-CHECK CODES

(75) Inventors: Seho Myung, Suwon-si (KR); Hwan-Joon Kwon, Suwon-si (KR); Jae-Yoel Kim, Suwon-si (KR); Yeon-Ju Lim, Seoul (KR); Sung-Ryul Yun, Suwon-si (KR); Hak-Ju Lee, Incheon (KR); Hong-Sii Jeong, Seoul (KR)

(73) Assignee: Samsung Electronics Co., Ltd (KR)

( * ) Notice: Subject to any disclaimer, the term of this patent is extended or adjusted under 35 U.S.C. 154(b) by 910 days.

(21) Appl. No.: 12/396,960

(22) Filed: Mar. 3, 2009

(65) Prior Publication Data

US 2009/0222706 A1 Sep. 3, 2009

(30) Foreign Application Priority Data

| Mar. 3, 2008 | (KR) | 10-2008-0019607 |
| Mar. 13, 2008 | (KR) | 10-2008-0023516 |
| Jun. 18, 2008 | (KR) | 10-2008-0057553 |
| Jan. 28, 2009 | (KR) | 10-2009-0006722 |

(51) Int. Cl.
*G06F 11/00* (2006.01)
(52) U.S. Cl. ........................................... 714/752
(58) Field of Classification Search .................. 714/752
See application file for complete search history.

(56) References Cited

U.S. PATENT DOCUMENTS

| 2005/0283708 A1 | 12/2005 | Kyung et al. |
| 2006/0123277 A1 | 6/2006 | Hocevar |
| 2007/0089025 A1 | 4/2007 | Hong et al. |
| 2007/0094580 A1* | 4/2007 | Livshitz ........................ 714/779 |
| 2007/0143656 A1* | 6/2007 | Niu et al. ....................... 714/752 |
| 2007/0162814 A1 | 7/2007 | Shen et al. |
| 2008/0204286 A1* | 8/2008 | Kose ............................... 341/67 |
| 2008/0288846 A1* | 11/2008 | Kyung et al. ................. 714/752 |

FOREIGN PATENT DOCUMENTS

| EP | 1 837 999 | 9/2007 |
| JP | 2007-531385 | 11/2007 |
| KR | 1020070034904 | 3/2007 |

OTHER PUBLICATIONS

Tao Tian et al., "Construction of Rate-Compatible LDPC Codes Utilizing Information Shortening and Parity Puncturing", Eurasip Journal on Wireless Communications and Networking, 2005.

* cited by examiner

*Primary Examiner* — Bryce Bonzo
(74) *Attorney, Agent, or Firm* — The Farrell Law Firm, P.C.

(57) ABSTRACT

An apparatus and a method for channel encoding/decoding in a communication system are provided. The apparatus and the method generate LDPC-encoded blocks with various lengths from an LDPC code with fixed length in a communication system using a Low-Density Parity-Check (LDPC) code. The apparatus and the method perform shortening using a predetermined number of shortened bits and perform LDPC encoding. The apparatus and the method apply predetermined rules according to the predetermined number of shortened bits and determine the number of bits to be punctured, and perform puncturing based on the determined number of punctured bits.

19 Claims, 13 Drawing Sheets

$$H_1 = \begin{bmatrix} 1 & 1 & 1 & 1 & 1 & 1 & 0 & 0 \\ 1 & 1 & 0 & 1 & 0 & 1 & 1 & 0 \\ 1 & 1 & 1 & 0 & 0 & 0 & 1 & 1 \\ 1 & 0 & 1 & 1 & 1 & 0 & 0 & 1 \end{bmatrix}$$

APPARATUS AND METHOD FOR CHANNEL ENCODING AND DECODING IN COMMUNICATION SYSTEM USING LOW-DENSITY PARITY-CHECK CODES

PRIORITY

This application claims priority under 35 U.S.C. §119(a) to Korean Patent Applications entitled "Apparatus and Method for Channel Encoding and Decoding in Communication System Using Low-Density Parity-Check Codes" that were filed in the Korean Intellectual Property Office on Mar. 3, 2008 and assigned Serial No. 10-2008-0019607, on Mar. 13, 2008 and assigned Serial No. 10-2008-0023516, on Jun. 18, 2008 and assigned Serial No. 10-2008-0057553, and on Jan. 28, 2009 and assigned Serial No. 10-2009-0006722, the contents of which are incorporated herein by reference.

BACKGROUND OF THE INVENTION

1. Field of the Invention

The present invention relates generally to a communication system using a Low-Density Parity-Check (LDPC) code, and more particularly, to an apparatus and a method, which efficiently generate an LDPC code and implement encoding and decoding of a channel.

2. Description of the Related Art

Inter-Symbol Interference (ISI) as well as various noises and fading of a channel significantly reduce the performance of a link in a wireless communication system. Therefore, it is essential to develop technology for overcoming the noise, fading, and ISI for the purpose of implementing high-speed digital communication systems, which require a large amount of data processing, high-speed data processing, and high reliability of data, such as next generation mobile communication, digital broadcasting, and mobile Internet. Active research has recently been conducted for utilization of an error-correcting code as a method for efficiently restoring the distorted information to its original state and improving the reliability of communication.

The LDPC code, which was first introduced by Gallager in the 1960's, has been underutilized due to its complex implementation, which by far surpassed the technology at that time. However, because a turbo code discovered by Berrou, Glavieux, and Thitimajshima in 1993 shows performance approaching Shannon's channel capacity, much analytical research has been conducted on the performance and characteristics of the turbo code. With this, much research has been conducted on channel encoding based on iterative decoding and graphs.

The research as described above has led to restudies of the LDPC code in the late 1990's. The restudies showed that the performance of the LDPC code approaches the Shannon's channel capacity when decoding is performed using the iterative decoding based on a sum-product algorithm on a Tanner graph (a special case of a factor graph) corresponding to the LDPC code.

The LDPC code is usually represented using a graph representation method. Also, many characteristics of the LDPC code can be analyzed using methods based on graph theory, algebra, and probability theory. In general, a graph model of a channel code is useful for describing a code. When information on an encoded bit corresponds to a vertex in a graph and the relation between encoded bits corresponds to an edge (i.e. a line segment) in the graph, the graph model of the channel code may be considered a communication network in which vertexes exchange predetermined messages through edges. Accordingly, it is possible to derive a natural decoding algorithm. For example, a decoding algorithm derived from a trellis, which may be considered a type of graph, includes a well-known Viterbi algorithm and a Bahl, Cocke, Jelinek, and Raviv (BCJR) algorithm.

The LDPC code is usually defined by a parity-check matrix, and can be represented using a bipartite graph commonly called a Tanner graph. In the bipartite graph, vertexes are divided into two different types. The LDPC code is represented by the bipartite graph formed by vertexes called "variable node" and "check node." A variable node corresponds to an encoded bit in the ratio of one to one.

Referring to FIGS. 1 and 2, a description is provided of a graph representation method of the LDPC code.

First, FIG. 1 illustrates an example of a parity-check matrix HI of the LDPC code, which includes four rows and eight columns. Referring to FIG. 1, 8 columns signify an LDPC code, which generates a codeword with a length of 8, and each column corresponds to encoded 8 bits.

FIG. 2 is a diagram illustrating a Tanner graph corresponding to H1 of FIG. 1.

Referring to FIG. 2, the Tanner graph of the LDPC code includes eight variable nodes $x_1$ 202, $x_2$ 204, $x_3$ 206, $x_4$ 208, $x_5$ 210, $x_6$ 212, $x_7$ 214 and $x_8$ 216, and 4 check nodes 218, 220, 222 and 224.

Herein, the $i^{th}$ column and $j^{th}$ row in the parity-check matrix H1 of the LDPC code correspond to the variable node $x_i$ and the $j^{th}$ check node, respectively. Also, the value 1, namely, which is not zero, of a position where the $i^{th}$ column intersects the $j^{th}$ row in the parity-check matrix H1 of the LDPC code, implies that an edge exists between the variable node $x_i$ and the $j^{th}$ check node in the Tanner graph of FIG. 2.

The degrees of each variable node and each check node in the Tanner graph of the LDPC code signify the number of edges making a connection between the nodes. The number of edges is equal to the number of entries (i.e. elements), which are not zeros, in a column or row corresponding to a relevant node in the parity-check matrix H1 of the LDPC code.

For example, in FIG. 2, the degrees of the variable nodes $x_1$ 202, $x_2$ 204, $x_3$ 206, $x_4$ 208, $x_5$ 210, $x_6$ 212, $x_7$ 214 and $x_8$ 216 are 4, 3, 3, 3, 2, 2, 2 and 2, respectively. The degrees of the check nodes 218, 220, 222 and 224 are 6, 5, 5 and 5, respectively. Also, the numbers of entries, which are not zeros, in columns of the parity-check matrix H1 of FIG. 1 respectively corresponding to the variable nodes of FIG. 2 coincide with degrees 4, 3, 3, 3, 2, 2, 2 and 2, in regular sequence. The numbers of entries, which are not zeros, in rows of the parity-check matrix H1 of FIG. 1 respectively corresponding to the check nodes of FIG. 2 coincide with degrees 6, 5, 5 and 5, in regular sequence.

In order to represent the degree distribution of the nodes of the LDPC code, the ratio of the number of variable nodes, all having a degree of I, to the total number of variable nodes, is set to $f_i$, and the ratio of the number of check nodes, all having a degree of j, to the total number of check nodes, is set to $g_j$.

For example, in the case of the LDPC code as shown in FIGS. 1 and 2, $f_i=0$ with respect to $f_2=4/8$, $f_3=3/8$, $f_4=1/8$, and $i \neq 2, 3$, and 4, and $g_j=0$ with respect to $g_5=3/4$, $g_6=1/4$, and $j \neq 5$ and 6. When the length of the LDPC code is set to N (i.e. the number of columns is set to N) and the number of rows is set to N/2, a density of entries, which are not zeros, in the entire parity-check matrix having the degree distribution as described above is calculated by Equation (1) below.

$$\frac{2f_2N + 3f_3N + 4f_4N}{N \times N/2} = \frac{5.25}{N} \quad (1)$$

In Equation (1), the density of 1s continues to decrease in the parity-check matrix H1 when N increases. It is usual that the density of entries, which are not zeros, is inversely proportional to the code length N in the LDPC code. Accordingly, when N is large, the density of the entries, which are not zeros, is very small. For this reason, the LDPC code includes the meaning of low-density in its name.

Structural characteristics of the parity-check matrix H1 of the LDPC code, to which the present invention is applied, are described with reference to FIG. 3.

FIG. 3 illustrates the LDPC code adopted as a standard technology in Digital Video Broadcasting-Satellite transmission $2^{nd}$ generation (DVB-S2), one of the digital broadcasting standards.

In FIG. 3, $N_1$ and $K_1$ represent a block length and length of an information word in the LDPC code. $(N_1-K_1)$ represents parity length. Also, $M_1$ and q are determined in such a manner that $q=(N_1-K_1)/M_1$ may be established. At this time, $K_1/M_1$ is determined to be an integer.

Referring to FIG. 3, the structure of a parity part (i.e. from the $K_1^{th}$ column to the $(N_1-1)^{th}$ column) in the parity-check matrix is in a dual diagonal form. Accordingly, degree distributions of columns, which correspond to the parity part, all have a value of 2, except for the last column all having a value of 1.

Rules applied to the structure of the information word part (i.e. from the $0^{th}$ column to the $(K_1-1)^{th}$ column) in the parity-check matrix are as follows.

Rule 1: $K_1/M_1$ column groups are generated in total by dividing $K_1$ columns corresponding to the information word in the parity-check matrix into groups, each of which has $M_1$ columns.

A method for forming a column belonging to each column group follows Rule 2 below.

Rule 2: positions of 1s are determined in the $0^{th}$ column of the $i^{th}$ ($i=1, \ldots, K_1/M_1$) column group.

When the degree of the $0^{th}$ column belonging to the $i^{th}$ column group is represented as $D_i$, if it is assumed that positions of rows having 1s as their entries are represented as $R_{i,0}^{(1)}, R_{i,0}^{(2)}, \ldots, R_{i,0}^{(D_i)}$, positions $R_{i,j}^{(k)}$ ($k=1,2,\ldots,D_i$) of the rows, which have 1s as their entries in the $j^{th}$ ($j=1,2,\ldots,M_1-1$) column belonging to the $i^{th}$ column group, are defined by Equation (2) below.

$$R_{i,j}^{(k)} = R_{i,(j-1)}^{(k)} + q \bmod(N_1-K_1) \quad k=1,2,\ldots,D_i,$$
$$i=1,\ldots,K_1/M_1, \text{ and } j=1,\ldots,M_1-1 \quad (2)$$

When Rule 2 is applied, degrees of the columns belonging to the $i^{th}$ ($i=1, \ldots, K_1/M_1$) column group are all fixed to $D_i$. In order to facilitate easy understanding of the structure of the DVB-S2 LDPC code, which stores therein information on the parity-check matrix by Rule 2, the following example is considered.

When it is assumed that $N_1=30$, $K_1=15$, $M_1=5$, and $q=3$, position information of rows having 1s as their entries in each of the $0^{th}$ columns of three column groups can be expressed as three sequences below. Herein, for the convenience of description, the three sequences are defined by weight-1 position sequences below.

$R_{1,0}^{(1)}=0, R_{1,0}^{(2)}=1, R_{1,0}^{(3)}=2,$ $R_{2,0}^{(1)}=0, R_{2,0}^{(2)}=11, R_{2,0}^{(3)}=13,$ $R_{3,0}^{(1)}=0, R_{3,0}^{(2)}=10, R_{3,0}^{(3)}=14$

The weight-1 position sequences may be expressed as only relevant position information for each column group as follows:

0   1   2

0   11   13

0   10   14.

Namely, a sequence of the $i^{th}$ column is obtained by sequentially representing the position information of the rows having 1s as their entries in the $i^{th}$ column group.

When a parity-check matrix is formed using both information corresponding to the example and Rules 1 and 2 as described above, an LDPC code of FIG. 4 below can be generated in such a manner as to have the same conception as that of the DVB-S2 LDPC code.

FIG. 4 illustrates an example of the parity-check matrix of the LDPC code.

It is possible to perform efficient encoding using a structural form in the DVB-S2 LDPC code designed by Rules 1 and 2. A process for performing LDPC encoding using the parity-check matrix of the DVB-S2 is described using the following example.

An encoding process using the DVB-S2 LDPC code when $N_1=16200$, $K_1=10800$, $M_1=360$ and $q=15$, is provided. Also, information word bits with a length of $K_1$ are represented as $(i_0, i_1, \ldots, i_{K_1-1})$, and parity bits with a length of $(N_1-K_1)$ are represented as $(p_0, p_1, \ldots, p_{N_1-K_1-1})$.

Step 1: an encoder initializes parity bits as follows:

$p_0=p_1=\ldots=p_{N_1-K_1-1}=0.$

Step 2: information on rows, which have 1s as their entries in the $0^{th}$ column belonging to the first column group of an information word, is read from position information of the stored parity-check matrix.

An example of only relevant position information of the read information can be represented as follows:
0 2084 1613 1548 1286 1460 3196 4297 2481 3369 3451 4620 2622.

Also, multiple pieces of the relevant position information of the read information can be expressed as weight-1 position sequences as follows:

$R_{1,0}^{(1)}=0, R_{1,0}^{(2)}=2084, R_{1,0}^{(3)}=1613, R_{1,0}^{(4)}=1548,$
$R_{1,0}^{(5)}=1286, R_{1,0}^{(6)}=1460, R_{1,0}^{(7)}=3196,$
$R_{1,0}^{(8)}=4297, R_{1,0}^{(9)}=2481, R_{1,0}^{(10)}=3369,$
$R_{1,0}^{(11)}=3451, R_{1,0}^{(12)}=4620, R_{1,0}^{(13)}=2622.$

The read information and an information bit $i_0$ are used to update particular parity bits $p_x$s, as defined in Equation (3) below, where x represents each of $R_{1,0}^{(k)}$, k+1,2, . . . , and 13.

$p_0 = p_0 \oplus i_0, p_{2084} = p_{2084} \oplus i_0, p_{1613} = p_{1613} \oplus i_0,$
$p_{1548} = p_{1548} \oplus i_0, p_{1286} = p_{1286} \oplus i_0,$
$p_{1460} = p_{1460} \oplus i_0, p_{3196} = p_{3196} \oplus i_0,$
$p_{4297} = p_{4297} \oplus i_0, p_{2481} = p_{2481} \oplus i_0,$
$p_{3369} = p_{3369} \oplus i_0, p_{3451} = p_{3451} \oplus i_0,$
$p_{4620} = p_{4620} \oplus i_0, p_{2622} = p_{2622} \oplus i_0 \quad (3)$ In Equation (3), $p_x = p_x \oplus i_0$ may be represented as $p_x \leftarrow p_x \oplus i_0$, and $\oplus$ signifies a binary addition.

Step 3: the value of each of 359 information word bits $i_m$ (m=1,2, ... ,359) following $i_0$ is calculated by Equation (4) below.

$$\{x+(m \bmod M_1) \times q\} \bmod(N_1-K_1), M_1=360, \text{ and } m=1, 2,...,359 \quad (4)$$

In Equation (4), x represents the value of each of $R_{1,0}^{(k)}$, k+1,2, ... ,13. In this case, equation (4) has the same concept as equation (2).

Next, the values obtained by equation (4) are used to perform calculations similar to Equation (3).

Namely, $P\{x+(m \bmod M_1) \times q\} \bmod(N_1-K_1)$ is updated for $i_m$. For example, when m=1, i.e. for $i_1$, $P(x+q) \bmod(N_1-K_1)$ are updated by Equation (5) below.

$$p_{15}=p_{15} \oplus i_1, p_{2099}=p_{2099} \oplus i_1, p_{1628}=p_{1628} \oplus i_1$$
$$p_{1563}=p_{1563} \oplus i_1, p_{1301}=p_{1301} \oplus i_1,$$
$$p_{1475}=p_{1475} \oplus i_1, p_{3211}=p_{3211} \oplus i_1,$$
$$p_{4312}=p_{4312} \oplus i_1, p_{2496}=p_{2496} \oplus i_1,$$
$$p_{3384}=p_{3384} \oplus i_1, p_{3466}=p_{3466} \oplus i_1,$$
$$p_{4635}=p_{4635} \oplus i_1, p_{2637}=p_{2637} \oplus i_1 \quad (5)$$

Equation (5) corresponds to a case where q is assumed to be equal to 15. The process as described above is performed in the same manner for m=1, 2, ... , 359.

Step 4: information of $R_{2,0}^{(k)}$ (k=1,2, ... ,13) is read and a particular parity bit $p_x$ is updated, with respect to the $361^{st}$ information word bit $i_{360}$ in the same manner as Step 2 as described above. Herein, x represents $R_{2,0}^{(k)}$. $P\{x+(m \bmod M_1) \times q\} \bmod(N_1-K_1)$ (where m=361, 362, ... , 719) is updated by similarly applying Equation (4) to 359 information word bits $i_{361}, i_{362}, \ldots,$ and $i_{719}$ following $i_{360}$.

Step 5: the process of Steps 2, 3 and 4 is repeated for each information word bit group with 360 information word bits.

Step 6: finally, parity bits are determined by Equation (6) below.

$$p_i=p_i \oplus p_{i-1}(i=1,2,\ldots N_1-K_1-1) \quad (6)$$

In Equation (6), pus are parity bits obtained by completing the LDPC encoding.

The LDPC encoding is performed through the process of Steps 1 to 6 in the DVB-S2, as described above.

Meanwhile, the LDPC encoding as described above should be designed in a manner suitable for supporting the amount of data transmission required by an actual communication system. Particularly, LDPC encoding having various block lengths for supporting various amounts of data transmission according to service requests is necessary for a communication system supporting various broadcasting services, as well as an adaptive communication system, to which a Hybrid Automatic Retransmission reQuest (HARQ) scheme, an Adaptive Modulation and Coding (AMC) scheme, etc. are applied for supporting high-speed data transmission.

However, in the conventional LDPC encoding, LDPC codewords all having the same length are generated, so that there is a limit on encoding and decoding a channel.

Therefore, an LDPC encoding scheme is necessary for a high-speed digital communication system, which requires a larger amount of data processing, higher-speed data processing, and higher reliability of data. Also, there is a need for channel encoding and decoding schemes, to which a more efficient LDPC codeword is applied.

SUMMARY OF THE INVENTION

The present invention has been made to address at least the above problems and/or disadvantages and to provide at least the advantages described below. Accordingly, an aspect of the present invention provides an apparatus and a method, which apply shortening or puncturing to an LDPC code with a fixed length and generate an LDPC code with a variable length in a communication system.

Another aspect of the present invention provides an apparatus and a method, which change a ratio of the number of shortened bits to the number of punctured bits by predetermined rules and generate an LDPC code with a variable length in a communication system.

An additional aspect of the present invention provides an apparatus and a method, which use shortening or puncturing to generate an LDPC code with a variable length from an LDPC code with a fixed length and encode/decode a channel using the generated LDPC code.

According to one aspect of the present invention, a method is provided for encoding a channel in a communication system using a Low-Density Parity-Check (LDPC) code. Shortening is performed using a predetermined number of shortened bits. LDPC encoding is performed. Predetermined rules are applied according to the predetermined number of shortened bits, and a number of bits to be punctured is determined. Puncturing is performed based on the determined number of bits to be punctured.

According to another aspect of the present invention, a method is provided for decoding a channel in a communication system using a Low-Density Parity-Check (LDPC) code. A shortening and puncturing pattern is determined based on a received signal. A value of a shortened bit is set to 0 according to the determined shortening pattern, erasures are set according to the determined puncturing pattern, and LDPC decoding is performed, when bits exist which have been used to perform shortening or puncturing. The step of determining a shortening and puncturing pattern comprises the setting of a ratio of the number of punctured bits to the number of shortened bits to (B+1)/B, where B is an integer.

According to an additional aspect of the present invention, an apparatus is provided for encoding a channel in a communication system using a Low-Density Parity-Check (LDPC) code. The apparatus includes a shortening pattern application unit for performing shortening using a predetermined number of shortened bits. The apparatus also includes an LDPC encoder for performing encoding based on an LDPC code shortened by the shortening pattern application unit. The apparatus further includes a control unit for applying predetermined rules to the number of shortened bits, and determining a number of bits to be punctured. The apparatus additionally includes a puncturing pattern application unit for carrying out puncturing on an LDPC codeword generated by the LDPC encoder based on the determined number of bits to be punctured.

According to a further aspect of the present invention, an apparatus is provided for decoding a channel in a communication system using a Low-Density Parity-Check (LDPC) code. The apparatus includes a demodulator for receiving and demodulating a channel. The apparatus also includes a shortening/puncturing pattern determination or estimation unit for determining a predetermined shortening and puncturing pattern based on the demodulated signal, and providing position information on bits to be shortened and punctured to an LDPC decoder. The apparatus further includes the LDPC decoder for inserting as many zeros as the number of shortened bits and setting as many erasures as the number of punctured bits, according to the provided position information on the bits to be shortened and punctured, and decoding the LDPC code.

BRIEF DESCRIPTION OF THE DRAWINGS

The above and other features, aspects, and advantages of the present invention will be more apparent from the following detailed description when taken in conjunction with the accompanying drawings, in which.

DETAILED DESCRIPTION OF THE PREFERRED EMBODIMENTS

Figures 1, 2:
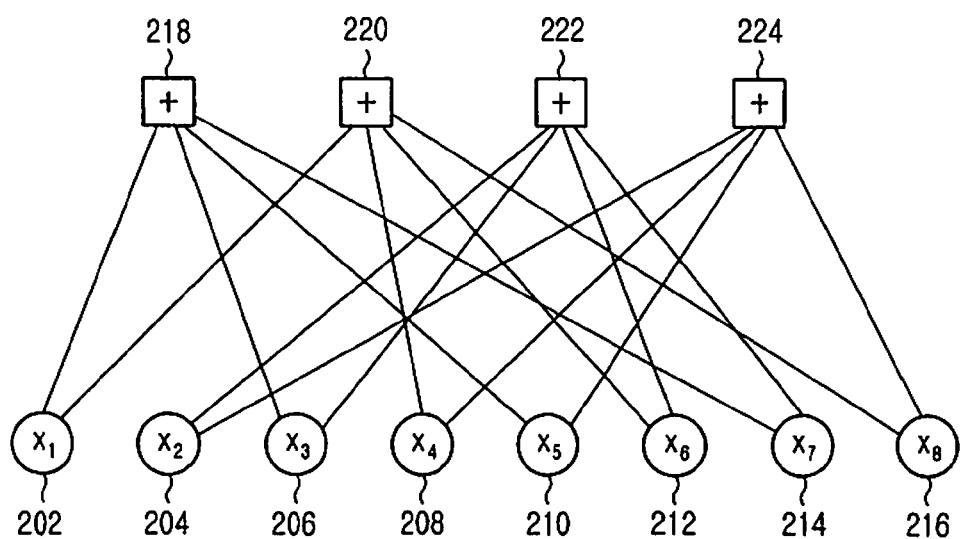
FIG. 1 illustrates a parity-check matrix of an LDPC code with a length of 8.
FIG. 2 is a diagram illustrating a Tanner graph of the parity-check matrix of the LDPC code with the length of 8.

Preferred embodiments of the present invention are described in detail with reference to the accompanying drawings. It should be noted that the same or similar components are designated by the same or similar reference numerals although they are illustrated in different drawings. Detailed descriptions of constructions or processes known in the art may be omitted to avoid obscuring the subject matter of the present invention.

The present invention provides a method by which, in a system for applying shortening and puncturing to LDPC encoding, a ratio of shortened bits to punctured bits is changed by predetermined rules in order to minimize the change of an effective reception range caused because the ratio of the shortened bits to the punctured bits is fixed. Also, the present invention provides an apparatus, which generates an LDPC encoded block with various block lengths in a communication system using an LDPC code, and a method for controlling the same.

Figure 5:
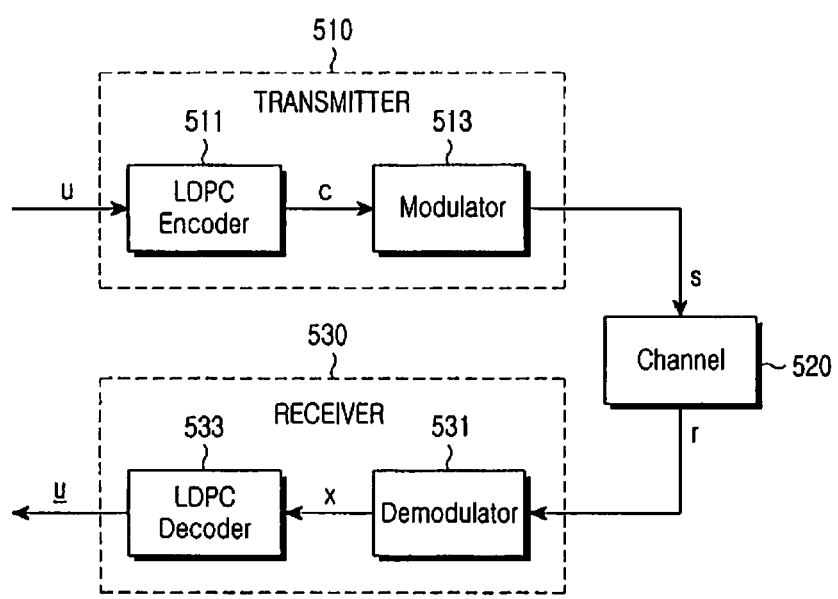
FIG. 5 is a block diagram illustrating a configuration of a transceiver in a communication system using an LDPC code, to which an embodiment of the present invention is applied.

FIG. 5 is a block diagram illustrating a configuration of a transceiver in the communication system using the LDPC code, to which the present invention is applied.

Referring to FIG. 5, an input signal u is encoded by an LDPC encoder 511 of a transmitter 510 which outputs signal c. Signal c is modulated by a modulator 513, which outputs signal s for transmission through a wireless channel 520. Then, a demodulator 531 of a receiver 530 demodulates a signal r from a receive (Rx) channel and outputs signal x. An LDPC decoder 533 estimates an estimate u based on the demodulated Rx channel. In this case, the LDPC encoder 511 generates a parity-check matrix in such a manner as to satisfy a block length required by the communication system in a preset scheme.

Particularly, the LDPC encoder 511 according to the present invention, which uses the LDPC code and therefore does not need separate additional storage information, supports various block lengths. A method for supporting the various block lengths according to the present invention uses a puncturing or shortening technique.

Puncturing refers to a technique which performs LDPC encoding on a given particular parity-check matrix, generates an LDPC codeword, and then does not actually transmit a particular part of the LDPC codeword. Accordingly, the receiver determines the part, which is not transmitted, to be erasure.

Meanwhile, when puncturing is compared with shortening, the two techniques have a common feature in reducing the block length of the LDPC codeword. However, puncturing differs from shortening in that it puts no limitation on the value of a particular bit. Namely, in puncturing, a particular part from among particular information word bits or generated parity bits is not transmitted, and the receiver processes the non-transmitted particular part as erasure.

Puncturing will be described using a parity-check matrix of a DVB-S2 LDPC code shown in FIG. 3.

Figure 3:
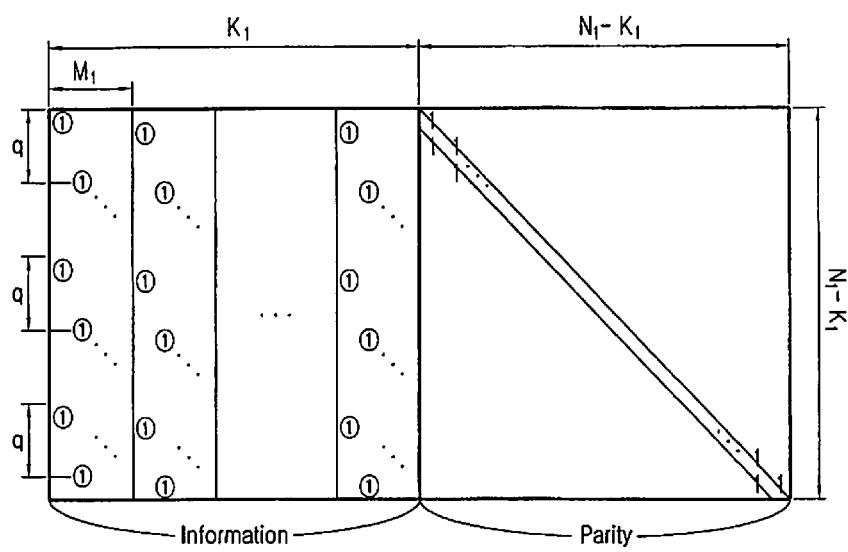
FIG. 3 is a diagram illustrating a schematic structure of a DVB-S2 LDPC code.
Figure 4:
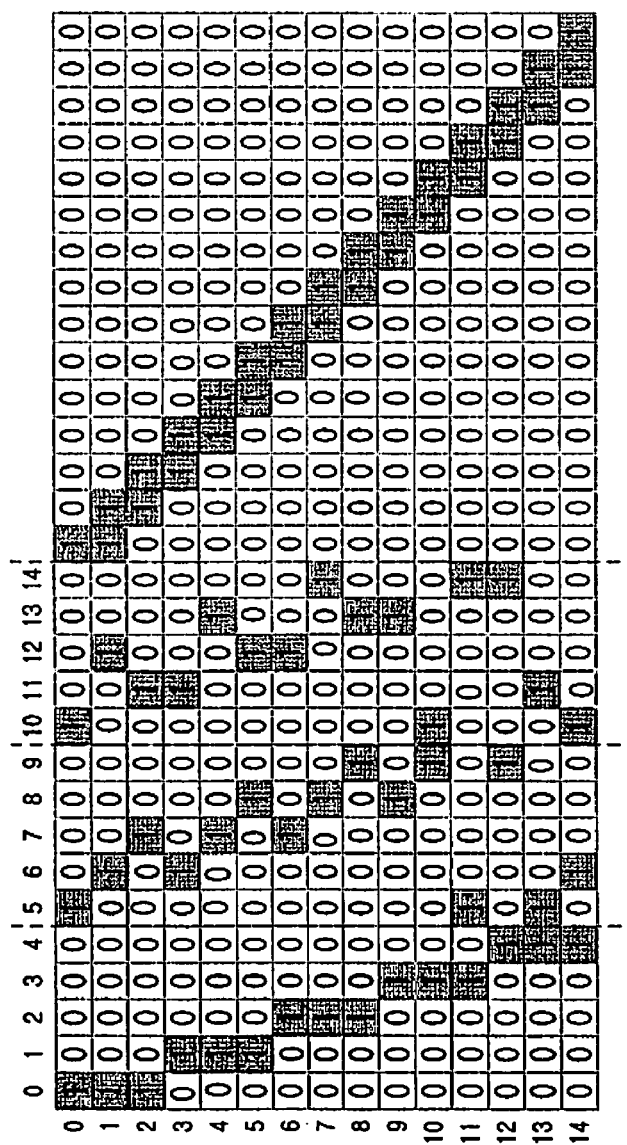
FIG. 4 illustrates a parity-check matrix of an LDPC code in the form of DVB-S2.

In the parity-check matrix shown in FIG. 3, the total length is $N_1$, the front part corresponds to information word bits $(i_0, i_1, \ldots, i_{K_1-1})$ with a length of $K_1$, and the rear part corresponds to parity bits $(p_0, p_1, \ldots, p_{N_1-K_1-1})$ with a length of $N_1-K_1$.

That is, when only bits at $N_P$ promised positions from among already-generated LDPC codewords, all having the length of $N_1$, are not transmitted, there occurs the same effect as that of transmission of an LDPC codeword with a length of $N_1-N_P$.

In the parity-check matrix described above, columns corresponding to the punctured bits are all used with nothing missed in a decoding process. Therefore, puncturing differs from shortening in this respect.

When the system is set, the transmitter and receiver can share or estimate the position information on the punctured bits in the same manner. Therefore, the receiver processes the relevant punctured bits only as erasures, and performs decoding.

Depending on the puncturing, the length of a block, which is actually transmitted by the transmitter, is $N_1-N_P$, and the length of an information word is unchangingly $K_1$. Accordingly, a code rate becomes $K_1/(N_1-N_P)$, and is always larger than a given initial code rate $K_1/N_1$.

The characteristics when the puncturing and shortening are simultaneously applied to the given LDPC encoding are described below.

For the convenience of description, a block length and information word length of an initial LDPC code are set to $N_1$ and $K_1$, respectively. Also, a block length and information word length of a final LDPC code are set to $N_2$ and $K_2$, respectively. The final LDPC code is intended to be finally obtained by performing shortening and puncturing on the initial LDPC code.

When defining $N_1-N_2=N_A$ and $K_1-K_2=K_S$, if as many bits as $K_S$ are shortened and as many bits as $N_P(=N_A-K_S)$ are punctured in the parity-check matrix of the DVB-S2 LDPC code, the LDPC code with $N_2$ and $K_2$ as its block length and information word length can be generated.

When $N_A>0$ or $K_S>0$ in the generated LDPC code, the code rate becomes $$\frac{K_1 - K_S}{N_1 - N_A},$$

which is usually different from the code rate $K_1/N_1$ of the DVB-S2 LDPC code. Accordingly, algebraic characteristics change. Herein, the case of $N_A=K_S$ corresponds to a case where both of the shortening and puncturing are not applied, or only the shortening is taken.

As described above, when properly adjusting the number of shortened bits and the number of punctured bits, the LDPC encoding can provide the code rate and block length required by the system.

In relation to this, the embodiments of the present invention propose a method, which properly adjusts the ratio of shortening to puncturing using the characteristics of the shortening and puncturing, generates codes with different code rates, and maximally maintains a predetermined effective reception range.

Figure 6A:
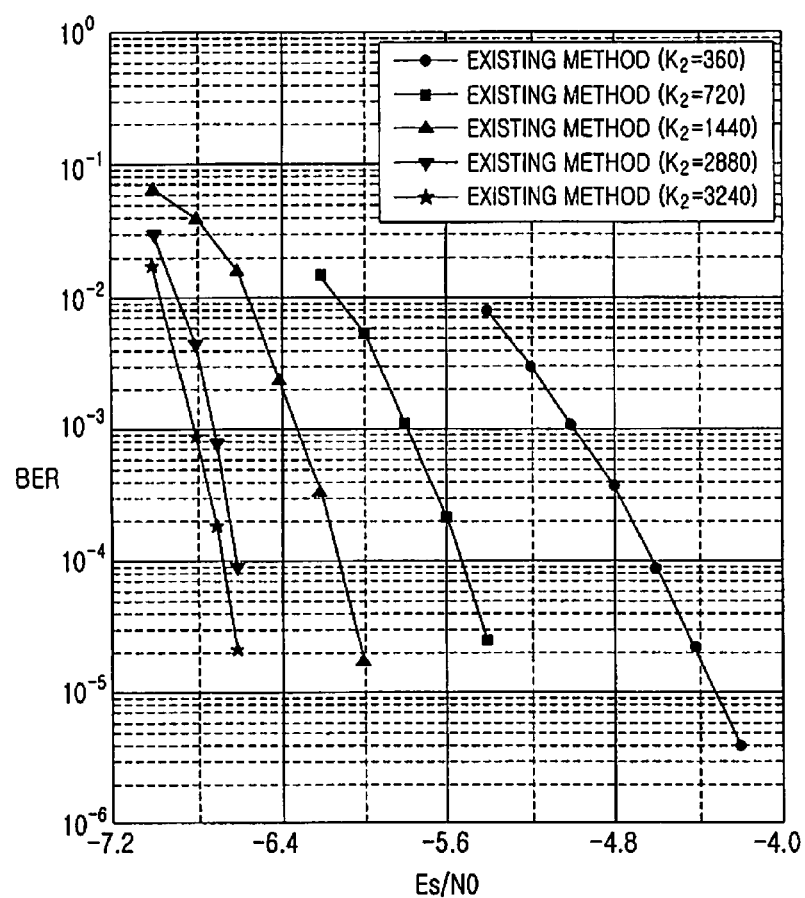
FIGS. 6A and 6B are graphs showing performance curves obtained by applying shortening and puncturing to DVB-S2 LDPC encoding, to which an embodiment of the present invention is applied.
Figure 6B:
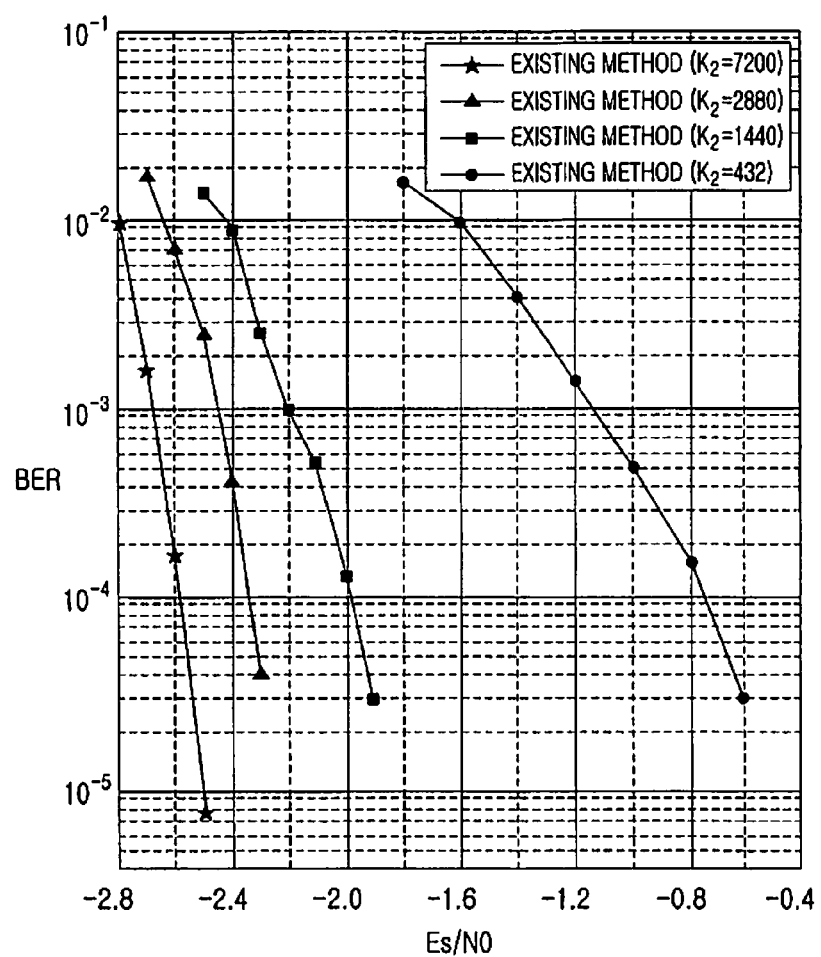

When shortening and puncturing of a particular pattern are applied, at a predetermined ratio, to both an DVB-S2 code, which has a code rate of 1/5, $N_1=16200$, $K_1=3240$, $M_1=360$, and $q_1=36$, and an DVB-S2 LDPC code, which has a code rate of 4/9, $N_1=16200$, $K_1=7200$, $M_1=360$ and $q_1=25$, system performances are illustrated in FIGS. 6A and 6B.

Referring to FIGS. 6A and 6B, a performance difference between a case when the shortening and puncturing are not applied at all near Bit Error Rate (BER)=$10^{-5}$ and a case when $K_2=360$, reaches approximately 2 dB.

In order to compensate for the loss of the effective reception range caused by the performance difference as described above, the same code rate should not be applied to an LDPC code after shortening and puncturing is applied to the LDPC encoding. Namely, in order to obtain an even larger encoding gain, an LDPC code with a low code rate should be transmitted through puncturing of even fewer bits.

In FIG. 6A, for example, $N_P$ has been set to 11520 in order to maintain a code rate of 1/5 when $K_2=360$. However, as $N_P$ is reduced by inches, the code rate gradually becomes smaller, and there occurs a case where the performance of the DVB-S2 LDPC code is nearly similar to that of the DVB-S2 code having $N_1=16200$, $K_1=3240$, $M_1=360$, and $q_1=36$.

Accordingly, little puncturing should be performed when a great amount of shortening is applied so that the performance of the given LDPC code and that of the LDPC code, to which shortening and puncturing are applied, may all have as high a predetermined value as possible.

Figure 7A:
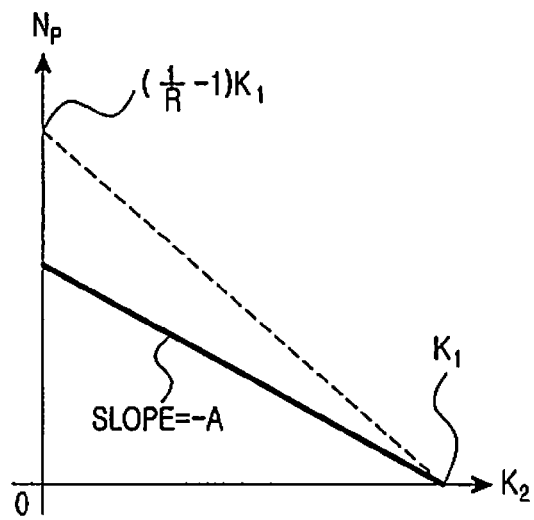
FIGS. 7A, 7B, and 7C are graphs showing relational formulas of the number of shortened bits vs. the number of punctured bits, according to an embodiment of the present invention.
Figure 7B:
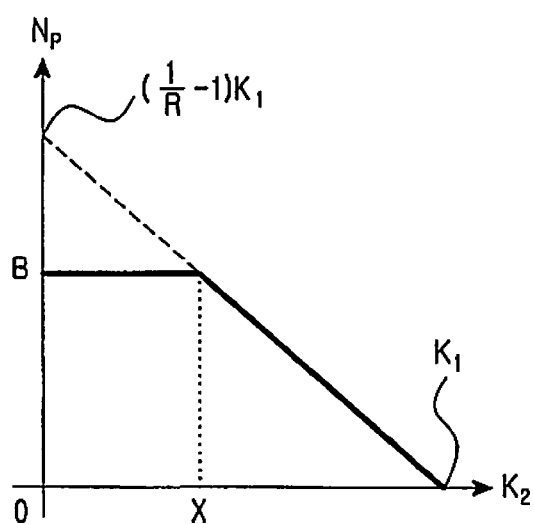
Figure 7C:
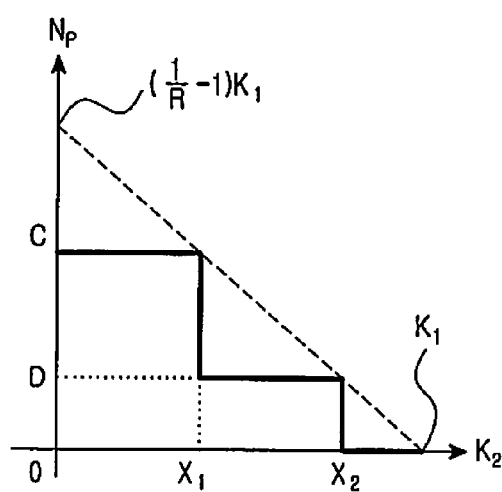

Therefore, the present invention proposes shortening and puncturing methods, which have relational graphs of FIGS. 7A, 7B, and 7C so that they can be applied simply while preventing, as much as possible, a great change in the effective reception range.

First, the relational graph of FIG. 7A can be expressed by Equation (7) below.

$$N_P = \lfloor (K_1 - K_2) \times A \rfloor = \lfloor -A \times K_2 + A \times K_1 \rfloor \quad (7)$$

where $\lfloor x \rfloor$ represents the maximum integer, which is smaller than or equal to x.

In Equation (7), A, which determines a slope value, is set to a value for determining a proper value of $N_P$ so that the performance of the LDPC code may not be degraded even when the value of $K_2$ becomes smaller.

The relational graph of FIG. 7B can be expressed by Equation (8) below.

$$\begin{cases} K_2 \leq X, & N_P = B \\ K_2 > X, & N_P = (K_1 - K_2)\left(\frac{1}{R} - 1\right) \end{cases} \quad (8)$$

In Equation (8), when the value of $K_2$ is smaller than or equal to a particular value, the predetermined number of punctured bits is maintained. On the other hand, when the value of $K_2$ is larger than the particular value, the number of bits, which is to be punctured by a particular ratio in proportion to $(K_1-K_2)$, is applied.

Meanwhile, in FIG. 7B, a region of $K_2$ is set to two intervals. However, the region of $K_2$ may be divided into more intervals than 2, and may be set to more intervals than 2.

The relational graph of FIG. 7C can be expressed by Equation (9) below.

$$\begin{cases} K_2 \leq X_1, & N_P = C \\ X_1 < K_2 \leq X_2, & N_P = D \\ K_2 > X_2, & N_P = 0 \end{cases} \quad (9)$$

Equation (9) discretely defines the number of punctured bits, depending on each region of $K_2$. In FIG. 7C, a region of $K_2$ is set to three intervals. However, the region of $K_2$ may be divided into more than 3 intervals, and may be set to more than 3 intervals.

A common feature of FIGS. 7A, 7B, and 7C corresponding to equations (7), (8), and (9) is that the ratio of shortening to puncturing becomes low when the length of $K_2$ is short. Accordingly, even when $K_2$ continues to become smaller, the performance of the LDPC code, to which the shortening and puncturing are applied, does not continue to be degraded. Particularly, in Equation (7) from among equations (7), (8), and (9), a good performance improvement can be obtained by taking different ratios of punctured bits for all $K_2$ S.

However, when some performance improvement and a low degree of implementation complexity are desired depending on each system, the method as defined by Equation (8) or (9) may be more efficient.

Figure 8A:
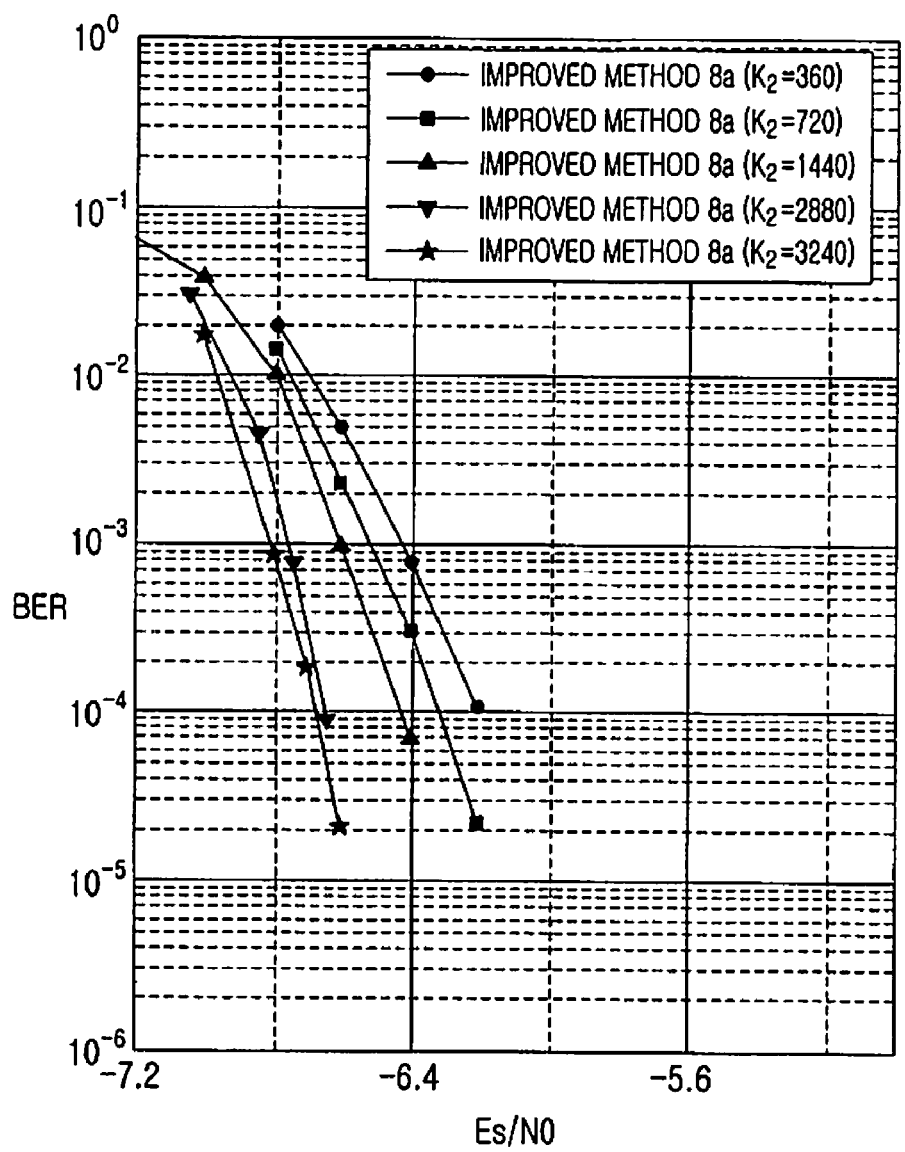
FIGS. 8A and 8B are graphs showing improved performances of DVB-S2 LDPC encoding, to which shortening and puncturing are applied, according to an embodiment of the present invention.
Figure 8B:
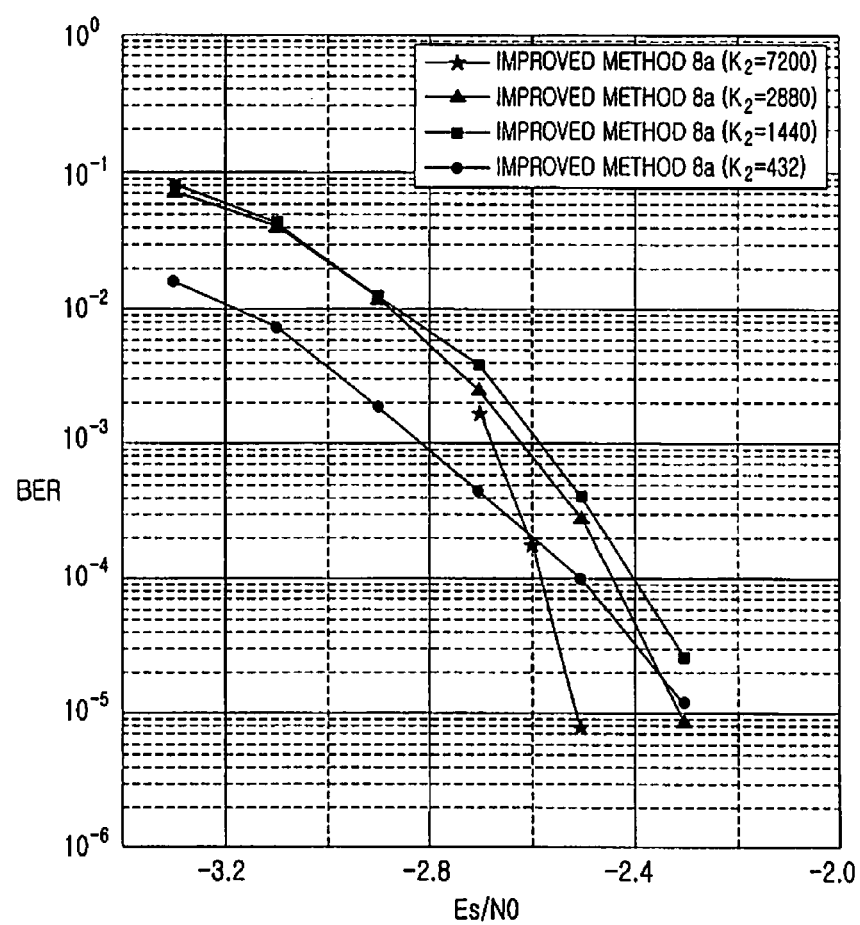

FIGS. 8A and 8B are graphs showing performances obtained by applying the method corresponding to equation (7) to the DVB-S2 LDPC code of FIGS. 6A and 6B in order to understand performances of the shortening and puncturing methods proposed by the embodiments of the present invention.

As shown in FIGS. 6A and 6B, the value of a performance difference between the case of $K_2$ with the smallest value and that of $K_2$ with the largest value is approximately 2 dB. However, it is noted from FIGS. 8A and 8B that the performance difference near BER=$10^{-5}$ significantly reduced to within 0.4 dB. Particularly, FIGS. 8A and 8B show performance curves of the DVB-S2 LDPC code, which have characteristics, including $N_1=16200$, $K_1=7200$, $M_1=360$ and $q_1=25$, and a code rate R of 4/9.

In FIG. 8A, Equation (10) is used to apply puncturing to the DVB-S2 LDPC encoding.

$$N_P = \left\lfloor -\frac{5}{4}(K_2 - K_1) \right\rfloor \quad (10)$$

In this case, since the number $N_P$ of bits to be punctured must become an integer, an $\lfloor x \rfloor$ operation is performed. When Equation (10) is used, the code rate has a value, which is nearly the same as 4/9. This can be checked using Equation (11) below.

$$R_2 = \frac{K_2}{N_2} = \frac{K_2}{K_2 + N_1(1-R) - N_P} \quad (11)$$
$$= \frac{K_2}{K_2 + \frac{K_1}{R} - K_1 - \left\lfloor \frac{5}{4}(K_1 - K_2) \right\rfloor}$$
$$\approx \frac{K_2}{K_2 + \frac{9}{4}K_1 - K_1 - \frac{5}{4}K_1 + \frac{5}{4}K_2} = \frac{K_2}{\frac{9}{4}K_2} = \frac{4}{9}$$

As shown FIG. 8B, a relational formula can be defined by Equation (12) in such a manner that a code, after shortening and puncturing are applied to the DVB-S2 LDPC encoding, may maximally maintain a predetermined effective reception range.

$$N_P = \left\lfloor -\frac{6}{5}(K_2 - K_1) \right\rfloor = \left\lfloor \frac{6}{5}(K_1 - K_2) \right\rfloor \quad (12)$$

In Equation (12), an integer 6/5 is a factor related to a slope, and has the best value when it is limited to the form of $$\frac{B+1}{B}$$

(B is an integer) for the convenience of design.

When Equation (12) is applied, an LDPC code rate $R_{eff}$, which is effective for the information word length $K_2$, can be expressed by Equation (13) below.

$$R_{eff} = \frac{K_2}{N_2} = \frac{K_2}{K_2 + N_1(1-R) - N_P} \quad (13)$$
$$= \frac{K_2}{K_2 + \frac{K_1}{R} - K_1 - \left\lfloor \frac{6}{5}(K_1 - K_2) \right\rfloor}$$
$$\approx \frac{K_2}{K_2 + \frac{9}{4}K_1 - K_1 - \frac{6}{5}K_1 + \frac{6}{5}K_2}$$
$$= \frac{K_2}{\frac{1}{20}K_1 + \frac{11}{5}K_2} = \frac{K_2}{360 + \frac{11}{5}K_2}$$

Figure 9:
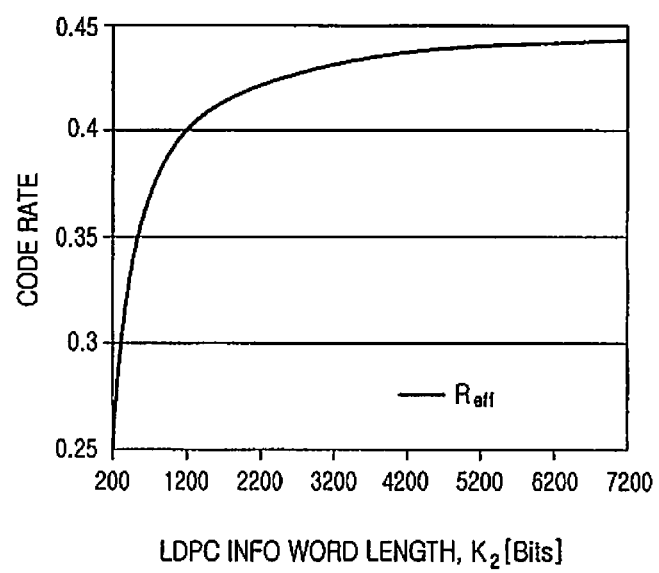
FIG. 9 is a graph showing the change of a code rate with respect to the length of an LDPC information word, according to an embodiment of the present invention.

FIG. 9 is a graph showing a change in the effective LDPC code rate $R_{eff}$ with respect to the information word length $K_2$, according to an embodiment of the present invention.

FIG. 9 shows that the shorter the information word length $K_2$, the lower the effective LDPC code rate $R_{eff}$. Also, the longer the information word length $K_2$, the higher the effective LDPC code rate $R_{eff}$. Namely, the effective LDPC code rate $R_{eff}$ also changes according to the change of the information word length $K_2$. Also, the value of $R_{eff}$ in a range of $K_2 \leq 7200$ is always smaller than or equal to 4/9.

For reference, a block length of the LDPC code according to the change of the effective LDPC code rate $R_{eff}$ can be approximately expressed by Equation (14) below.

$$N_2 \approx \frac{K_2}{R_{eff}} = 360 + \frac{11}{5}K_2 \quad (14)$$

As described above, a predetermined effective reception range can be maintained by changing the code rate in response to the information word length.

A formula, which performs substantially similar to that of Equation (13) can be expressed by Equation (15) below.

$$N_P = 6 \times \left\lfloor \frac{(K_1 - K_2)}{5} \right\rfloor \quad (15)$$

Even in all different cases of outputting similar $N_P$ values, as defined in Equation (15), operations may be properly adjusted according to the convenience of implementation, and similar performances can be supported.

When the value of a block length $K_2 + (N_1 - K_1 - N_P)$, after the application of shortening and puncturing to the DVB-S2 LDPC encoding, must become a multiple of m, an additional operation may be performed in each method for calculating values of Equation (7) through Equation (15) so that $K_2 + (N_1 - K_1 - N_P) = mC$ may be satisfied for a certain integer C.

Herein, $(N_1 - K_1 - N_P)$ is the number of parity bits, which are actually transmitted after the puncturing. Namely, each process of calculating values given in Equation (7) through Equation (14) may change by inches in response to additional conditions.

Figure 10:
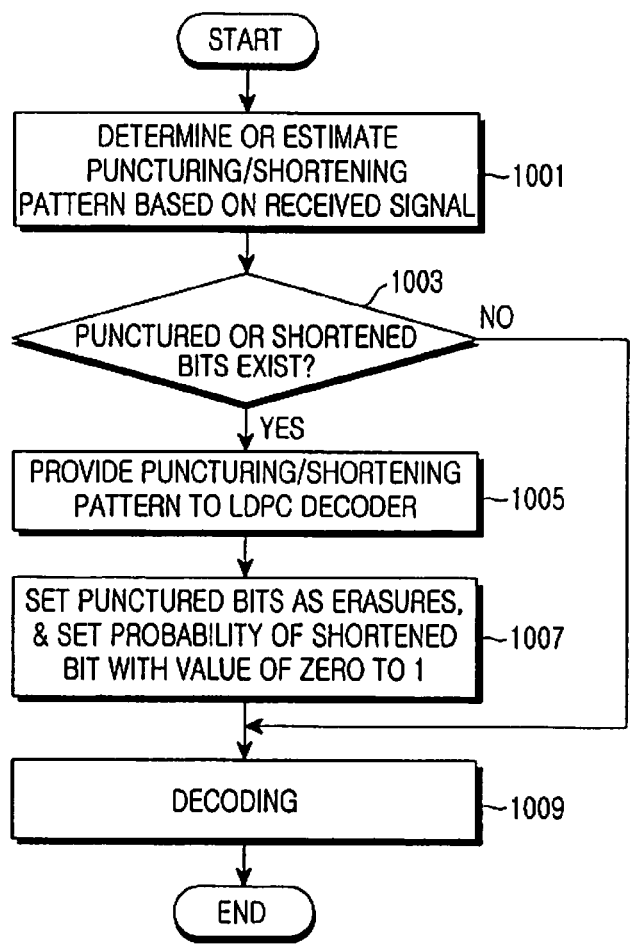
FIG. 10 is a flowchart illustrating an LDPC decoding process in a receiver when a puncturing pattern is applied, according to an embodiment of the present invention.

FIG. 10 is a flowchart illustrating a receiving process by the receiver according to an embodiment of the present invention.

Referring to FIG. 10, the receiver determines or estimates a puncturing and shortening pattern based on a received signal in step 1001.

The receiver determines in step 1003 if punctured or shortened bits exist.

When the determination in step 1003 shows that the punctured or shortened bits do not exist, the receiver goes to step 1009, and performs decoding.

On the other hand, when the determination in step 1003 shows that the punctured or shortened bits exist, the receiver goes to step 1005. The determined puncturing/shortening pattern is provided to the LDPC decoder in step 1005.

The LDPC decoder sets the determined punctured bits as erasures in step 1007. Also, the LDPC decoder sets, to 1, a probability that the value of a shortened bit will be zero.

Thereafter, the LDPC decoder performs decoding on bits, to which the puncturing and shortening are applied, in step 1009.

Figure 11:
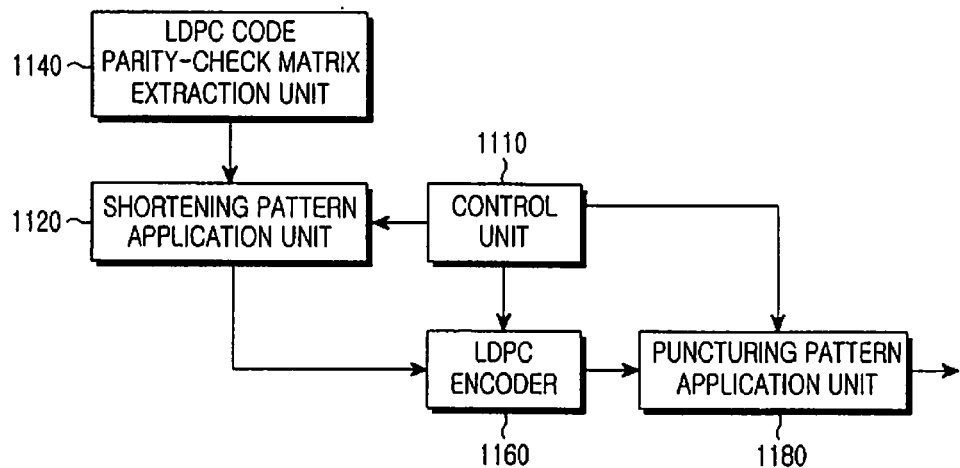
FIG. 11 is a block diagram illustrating a configuration of a transmitter using the LDPC code, to which puncturing and shortening proposed by an embodiment of the present invention are applied.

FIG. 11 is a block diagram illustrating a configuration of the transmitter using the LDPC code, to which puncturing and shortening are applied, according to an embodiment of the present invention.

Referring to FIG. 11, the transmitter includes a control unit 1110, a shortening pattern application unit 1120, an LDPC code parity-check matrix extraction unit 1140, an LDPC encoder 1160, and a puncturing pattern application unit 1180.

The LDPC code parity-check matrix extraction unit 1140 extracts a parity-check matrix of the LDPC code, which has taken shortening. The LDPC code parity-check matrix may be extracted using a check matrix, which is previously set in a memory. Also, the transmitter may directly generate the LDPC code parity-check matrix.

The control unit 1110 controls the shortening pattern application unit 1120 to determine a variable shortening pattern by considering an effective reception range depending on each length of the information word. The shortening pattern application unit 1120 acts as inserting a bit with a value of zero to a position corresponding to a shortened bit, or removing a column corresponding to shortened bits from the parity-check matrix of the given LDPC code.

At this time, the shortening pattern may be determined based on shortening patterns stored in a memory, or may be generated by a sequence generator (not shown), etc. Also, the shortening pattern may be determined by applying a density evolution analysis algorithm, etc. to the parity-check matrix and the given information word length.

Also, the control unit 1110 controls the puncturing pattern application unit 1180 to determine a puncturing pattern suitable for a modulation scheme and the length of bits to be punctured and apply the determined puncturing pattern. At this time, the puncturing pattern is determined so as to correct the effective reception range according to the length of signaling information. Also, the puncturing pattern application unit 1180 may determine puncturing of fewer bits in consideration of the shortening pattern.

The control unit 1110 and the shortening pattern application unit 1120 perform encoding based on the shortened LDPC code through the LDPC encoder 1160. An LDPC codeword, which has been generated by the LDPC encoder 1160, is used to perform puncturing by the puncturing pattern application unit 1180 in a manner suitable for the modulation scheme and the length of the bits to be punctured.

Figure 12:
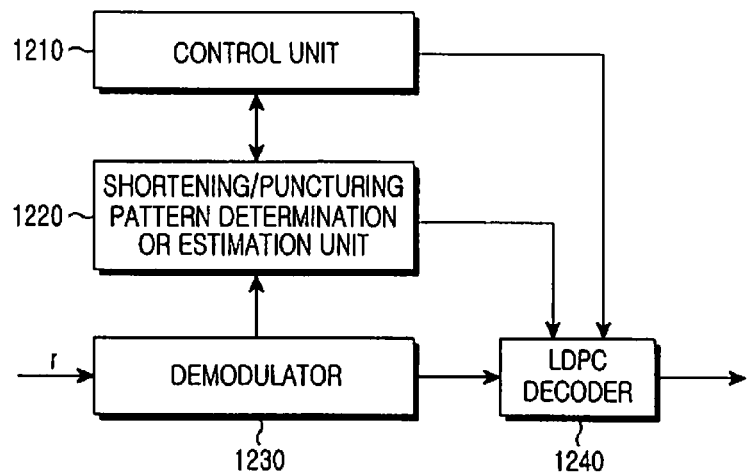
FIG. 12 is a block diagram illustrating a configuration of a receiver using the LDPC code, to which puncturing and shortening proposed by an embodiment of the present invention are applied.

FIG. 12 is a block diagram illustrating a configuration of the receiver according to an embodiment of the present invention. Particularly, FIG. 12 shows an example of the receiver, which receives a transmitted signal, and restores data desired by a user from the received signal, in the communication system using the DVB-S2 LDPC code, to which puncturing or shortening is applied.

Referring to FIG. 12, the receiver includes a control unit 1210, a shortening/puncturing pattern determination or estimation unit 1220, a demodulator 1230, and an LDPC decoder 1240.

The demodulator 1230 receives and demodulates the LDPC code, to which the shortening is applied. The shortening/puncturing pattern determination or estimation unit 1220 and the LDPC decoder 1240 receive the demodulated signal from the demodulator 1230.

The control unit 1210 controls the shortening/puncturing pattern determination or estimation unit 1220 to determine or estimate information on a puncturing or shortening pattern of the LDPC code from the demodulated signal. Then, the shortening/puncturing pattern determination or estimation unit 1220 provides position information on punctured bits and shortened bits, which has been determined, to the LDPC decoder 1240.

The shortening/puncturing pattern determination or estimation unit 1220 may generate a puncturing and shortening pattern using puncturing and shortening patterns stored in a memory or a previously-implemented generation method, etc. Other than this, the shortening/puncturing pattern determination or estimation unit 1220 may determine or estimate the puncturing and shortening pattern by applying the density evolution analysis algorithm to the parity-check matrix and the given information word length.

When both the shortening and puncturing are applied to the receiver in the same manner as the application thereof to the transmitter according to an embodiment of the present invention, the shortening/puncturing pattern determination or estimation unit 1220 may first determine or estimate the shortening pattern, or may first determine or estimate the puncturing pattern. Also, the determination or estimation of the shortening pattern may occur simultaneously with that of the puncturing pattern.

The LDPC decoder 1240 assumes that the probability of a punctured bit with zero and that of a punctured bit with 1 are equally 1/2, and performs decoding. Other than this, the LDPC decoder 1240 processes the punctured bits as erasures, and performs decoding. Also, the probability that the value of a shortened bit will be zero is 1, i.e. 100%. Therefore, the LDPC decoder 1240 prevents shortened bits from participating in its operation. Other than this, the LDPC decoder 1240 determines based on the probability 1 of a shortened bit with zero if it allows the shortened bits to participate in the decoding.

When checking the length of the LDPC code, which has been shortened by the shortening/puncturing pattern determination or estimation unit 1220, the LDPC decoder 1240 restores data desired by the user from the received signal.

As shown in FIG. 11, the transmitter according to an embodiment of the present invention performs shortening at a pre-stage of the input of the LDPC encoder 1160, and performs puncturing at an output stage of the LDPC encoder 1160. Meanwhile, in the receiver as shown in FIG. 12, the LDPC decoder 1240 performs decoding while knowing the information on the puncturing and shortening.

The apparatus and the method of the embodiments of the present invention generate an LDPC code with a variable length using information on a given parity-check matrix in a communication system using the LDPC code, and ensure the extensibility and flexibility of the communication system.

Also, the apparatus and the method of the embodiments of the present invention generate an LDPC code, which maximally maintain a predetermined effective reception range, using the information on the given parity-check matrix, and maximally ensure channel transmission, in the communication system using the LDPC code.

When applying shortening or puncturing to an LDPC codeword generated for supporting various block lengths according to the requirements of a system, the apparatus and the method of the embodiments of the present invention ensure that the performance of an LDPC code, which has performed the shortening or puncturing, is similar to system performance of an LDPC code before performing the shortening or puncturing. Therefore, the apparatus and the method of the embodiments of the present invention ensure faster data processing speed through the application of the shortening and puncturing to the LDPC encoding.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A method for encoding a channel in a communication system using a Low-Density Parity-Check (LDPC) code, the method comprising the steps of:
   performing shortening using a number of shortened bits;
   performing LDPC encoding; and
   performing puncturing based on a determined number of bits to be punctured, wherein the number of bits to be punctured is determined according to a predetermined ratio of the number of bits to be punctured to the number of shortened bits.

2. The method as claimed in claim 1, wherein the predetermined ratio of the number of bits to be punctured to the number of shortened bits is set to (B+1)/B, wherein B is an integer.

3. The method as claimed in claim 1, wherein the predetermined ratio of the number of bits to be punctured to the number of shortened bits is set to 5/4 or 6/5.

4. The method as claimed in claim 1, wherein performing shortening using the number of shortened bits comprises using a shortening pattern stored in a memory, or a parity-check matrix and a given length of an information word.

5. The method as claimed in claim 1, wherein the number of bits to be punctured is determined in accordance with:

$$N_P = \left\lfloor -\frac{6}{5}(K_2 - K_1) \right\rfloor = \left\lfloor \frac{6}{5}(K_1 - K_2) \right\rfloor,$$

where $N_p$, denotes the number of bits to be punctured, K1 denotes a length of an information word in an initial LDPC code before performing shortening and puncturing, and K2 denotes a length of an information word in a final LDPC code, after performing the shortening and the puncturing.

6. The method as claimed in claim 1, wherein a length of a coded block, after performing the shortening and the puncturing, is a multiple value of a predetermined integer value obtained by an additional operation in a predetermined condition.

7. A method for decoding a channel in a communication system using a Low-Density Parity-Check (LDPC) code, the method comprising the steps of:
determining a shortening pattern and a puncturing pattern based on a received signal; and
setting a value of a shortened bit to 0 according to the determined shortening pattern, setting erasures according to the determined puncturing pattern, and performing LDPC decoding, when bits exist which have been used to perform shortening or puncturing,
wherein determining the shortening pattern and the puncturing pattern comprises setting a ratio of the number of punctured bits to the number of shortened bits to (B+1)/B, wherein B is an integer.

8. The method as claimed in claim 7, wherein, in the step of determining a shortening and puncturing pattern, the ratio of the number of punctured bits to the number of shortened bits is 5/4 or 6/5.

9. The method as claimed in claim 7, wherein the number of punctured bits is determined in accordance:

$$N_P = \left\lfloor -\frac{6}{5}(K_2 - K_1) \right\rfloor = \left\lfloor \frac{6}{5}(K_1 - K_2) \right\rfloor,$$

where $N_p$ denotes the number of punctured bits, K1 denotes a length of an information word in an initial LDPC code before performing shortening and puncturing, and K2 denotes a length of an information word in a final LDPC code, after performing the shortening and the puncturing.

10. The method as claimed in claim 7, wherein a length of a coded block, after performing the shortening and the puncturing, is a multiple value of a predetermined integer value obtained by an additional operation in a predetermined condition.

11. An apparatus for encoding a channel in a communication system using a Low-Density Parity-Check (LDPC) code, the apparatus comprising:
a shortening pattern application unit for performing shortening using a number of shortened bits;
an LDPC encoder for performing encoding based on an LDPC code shortened by the shortening pattern application unit;
a control unit for determining a number of bits to be punctured according to a predetermined ratio of the number of bits to be punctured to the number of shortened bits; and
a puncturing pattern application unit for carrying out puncturing on an LDPC codeword generated by the LDPC encoder based on the determined number of bits to be punctured.

12. The apparatus as claimed in claim 11, wherein the control unit sets the predetermined ratio of the number of bits to be punctured to the number of shortened bits to (B+1)/B, wherein B is an integer.

13. The apparatus as claimed in claim 12, wherein the control unit sets the predetermined ratio of the number of bits to be punctured to the number of shortened bits to 5/4 or 6/5.

14. The apparatus as claimed in claim 11, wherein the number of bits to be punctured is determined in accordance with:

$$N_P = \left\lfloor -\frac{6}{5}(K_2 - K_1) \right\rfloor = \left\lfloor \frac{6}{5}(K_1 - K_2) \right\rfloor,$$

where $N_p$ denotes the number of bits to be punctured, K1 denotes a length of an information word in an initial LDPC code before performing shortening and puncturing, and K2 denotes a length of an information word in a final LDPC code, after performing the shortening and the puncturing.

15. The apparatus as claimed in claim 11, wherein a length of a coded block, after performing the shortening and the puncturing, is a multiple value of a predetermined integer value obtained by an additional operation in a predetermined condition.

16. An apparatus for decoding a channel in a communication system using a Low-Density Parity-Check (LDPC) code, the apparatus comprising:
a demodulator for receiving and demodulating a channel;
a shortening/puncturing pattern determination or estimation unit for determining a predetermined shortening and puncturing pattern based on a demodulated signal, and providing position information on bits that are shortened and punctured to an LDPC decoder; and
the LDPC decoder for inserting as many zeros as a number of shortened bits and setting as many erasures as a number of punctured bits, according to the position information on the bits to be shortened and punctured, and decoding the LDPC code,
wherein, in the shortening and puncturing pattern, a ratio of the number of punctured bits to the number of shortened bits is set to (B+1)/B, where B is an integer.

17. The apparatus as claimed in claim 16, wherein the shortening/puncturing pattern determination or estimation unit determines the ratio of the number of punctured bits to the number of shortened bits to be set to 5/4 or 6/5.

18. The apparatus as claimed in claim 16, wherein the number of punctured bits is determined in accordance with:

$$N_P = \left\lfloor -\frac{6}{5}(K_2 - K_1) \right\rfloor = \left\lfloor \frac{6}{5}(K_1 - K_2) \right\rfloor,$$

where $N_p$, denotes the number of bits punctured, K1 denotes a length of an information word in an initial LDPC code before performing shortening and puncturing, and K2 denotes a length of an information word in a final LDPC code after performing the shortening and the puncturing.

19. The apparatus as claimed in claim 16, wherein a length of a coded block, after performing the shortening and the puncturing, is a multiple value of a predetermined integer value obtained by an additional operation in a predetermined condition.

\* \* \* \* \*